United States Patent [19]
Corbeij et al.

[11] Patent Number: 5,058,263
[45] Date of Patent: Oct. 22, 1991

[54] MANIPULATION DEVICE

[75] Inventors: Peter H. J. Corbeij; Joseph J. H. M. Bongers, both of Eindhoven, Netherlands

[73] Assignee: U.S. Philips Corporation, New York, N.Y.

[21] Appl. No.: 576,321

[22] Filed: Aug. 29, 1990

[30] Foreign Application Priority Data

Dec. 21, 1989 [NL] Netherlands ................ 8903131

[51] Int. Cl.⁵ .................................... B23P 19/00
[52] U.S. Cl. ...................................... 29/740; 29/833; 29/834; 228/6.2; 414/917
[58] Field of Search .............. 414/917; 29/740, 741, 29/830, 833, 834, 840, 832; 228/6.2

[56] References Cited

U.S. PATENT DOCUMENTS 4,480,780 11/1984 Claeskens et al. .
4,631,816 12/1986 Fugita et al. .
4,644,642 2/1987 Wardenaar et al. .
4,644,642 2/1987 Wardenaar et al. .............. 29/834
4,664,591 5/1987 Faes et al. ...................... 414/753
4,819,699 4/1989 Brown et al. .
4,881,319 11/1989 Yagi et al. .

FOREIGN PATENT DOCUMENTS 56-153742 11/1981 Japan .
57-63835 4/1982 Japan .
57-63836 4/1982 Japan .
63-95631 4/1988 Japan .

Primary Examiner—Carl J. Arbes
Attorney, Agent, or Firm—William Squire

[57] ABSTRACT

At least two manipulators have parallel axes of rotation. Each manipulator is provided with an arm connected to a common coupling member. Movement of the coupling member rotates the manipulators about their axes. The arms describe paths which intersect each other. The manipulators comprise a positioning device suitable for placing electrical components on a support.

6 Claims, 3 Drawing Sheets

MANIPULATION DEVICE

BACKGROUND OF THE INVENTION

1. Field of the Invention

The invention relates to a device comprising at least two manipulators, which have parallel axes of rotation and which are rotated simultaneously by a coupling member, each manipulator being provided with an arm which is pivotably connected to the coupling member, the arms of the manipulators extending parallel to each other and have the same length.

Of interest is commonly owned copending application Ser. No. 460,460 entitled "Method and Device for Placing Components on a Support", filed Jan. 3, 1990 in the name of A. Weeber.

2. Description of the Prior Art

A device and a positioning device of the kind mentioned in the opening paragraph are known from U.S. Pat. No. 4,664,591.

In the known devices, the manipulators are driven in common by means of a coupling member. Each manipulator is provided to this end with an arm comprising a radius of a rotatable flange and with a pin connected to the flange. The coupling member is pivotably connected to the pin of each manipulator. The length of the arm is equal to the distance of the pin from the axis of rotation of the manipulator and is equally large for all manipulators. Connection lines perpendicular to the axes of the manipulators between the axes and the pins associated with the manipulators extend parallel for all manipulators. Via the coupling member, all manipulators are driven simultaneously so that identical rotary movements are performed.

A disadvantage of the known device is that the pitch distance between two adjacent manipulators is determined by the dimensions of the flanges and the length of the arms.

SUMMARY OF THE INVENTION

The invention has inter alia for its object to provide a device, in which a high degree of freedom is obtained in the choice of the distance between two adjacent manipulators.

A device according to the invention is for this purpose characterized in that each arm encloses an obtuse angle with the axis of rotation of the associated manipulator and encloses with a plane of projection perpendicular to the axis of rotation of the manipulator an acute angle forming part of the obtuse angle, while during operation corresponding points of the arms of two adjacent manipulators describe paths which, viewed in projection, intersect each other in the plane of projection.

The device according to the invention permits reducing the distance between two adjacent manipulators to a pitch distance which is determined only by other dimensions of the manipulators. The length of the arm of a manipulator no longer influences the pitch distance.

With a given distance between two pick-up devices, in the device according to U.S. Pat. No. 4,664,591 the length of the arm is determined by the distance between two pick-up devices. The invention further has for its object to provide a positioning device for placing electrical components on a support, in which the length of an arm no longer depends to such a great extent as before upon the distance between two adjacent pick-up devices.

The positioning device according to the invention is for this purpose characterized in that each arm encloses an obtuse angle with the axis of rotation of the associated pick-up device and encloses with a plane of projection perpendicular to the axis of rotation of the pick-up device an acute angle forming part of the obtuse angle, while during operation corresponding points of the arms of two adjacent manipulators describe paths which, viewed in projection, intersect each other in the plane of projection.

The positioning device according to the invention has great advantages because the accuracy with which a component picked up by a pick-up device is subjected to a given angular rotation should be as high as possible. The length of the arm is also determinative of the accuracy with which a given angular rotation can be obtained; the greater the length of the arm, the higher is the accuracy. The pick-up devices can be arranged at a comparatively small pitch distance, while the length of the arms can be chosen so that a desired accuracy is attained.

The invention further relates to a pick-up device suitable for use in such a device. The pick-up devices can be used individually or together with other pick-up devices, while by a comparatively great length of the arm a high accuracy can be obtained when performing an angular rotation.

IN THE DRAWING

The invention will be described more fully with reference to the drawing, in which:

FIG. 1 shows diagrammatically a device according to the invention, which is suitable for placing electrical components on a support, FIG. 2 is a plan view of the device shown in FIG. 1, FIG. 3 shows diagrammatically a pick-up device according to the invention.

DESCRIPTION OF THE PREFERRED EMBODIMENT

Figure 1:
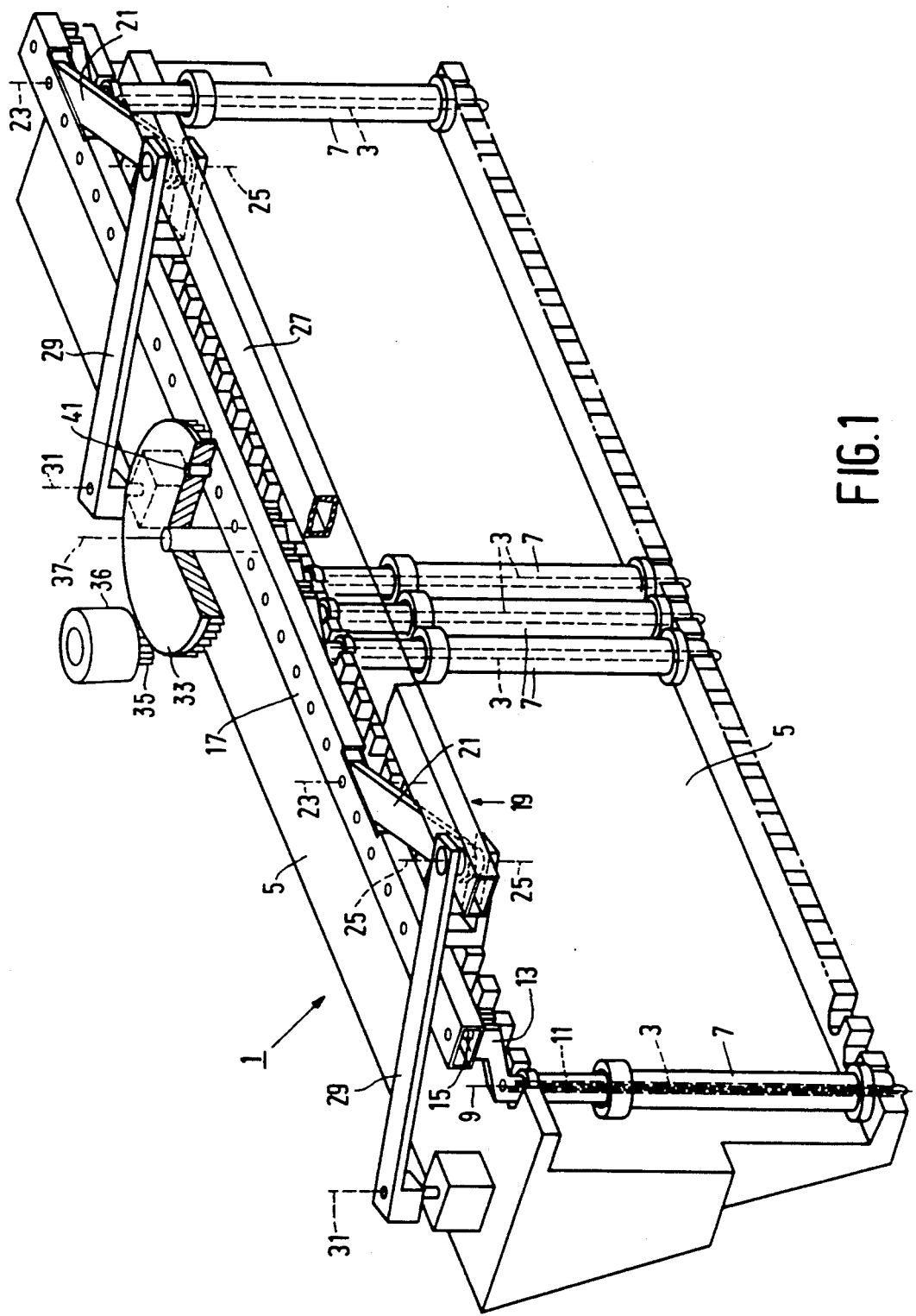

A device 1 shown in FIG. 1 has a row of pick-up devices 3 which, in the alternative, are generally referred to as manipulators herein. Each cylindrical pick-up device 3 is rotatable about an axis 9 and is journalled coaxially in a holder 7, which is connected to a frame 5. Each pick-up device 3 is provided with a coaxially arranged duct 11, in which a subatmospheric pressure can be produced so that the pick-up device 3 can suck up a component (not shown). Each pick-up device 3 has secured to it a crank 13 (arm), which is connected through a pin 15 pivotably to a coupling rod 17 (coupling member). The parallel extending cranks have the same length. When the coupling rod 17 is driven in a manner to be described more fully hereinafter, the cranks 13 and hence also the pick-up devices 3 perform a rotary movement about the axes 9. A point of a crank 13 corresponding to the pin 15 then describes a path 43 which partly coincides with a path 43 described by a corresponding point of a crank 13 of an adjacent pick-up device (see also FIG. 2). The coupling rod 17 forms part of a parallel mechanism 19, as a result of which the coupling rod 17 always remains in a position which is parallel to a preceding position. The parallel mechanism 19 comprises the coupling rod 17, two auxiliary rods 21, an auxiliary coupling rod 27 and two base rods 29. The two auxiliary rods 21 are each connected at one end to the coupling rod 17 so as to be pivotable about an axis 23 and are connected at their other end to the auxiliary coupling rod 27 so as to be pivotable about an axis 25. The two base rods 29 are each connected at one end to the auxiliary coupling rod 27 so as to be pivotable about the respective axis 25 and are connected at another end to the frame 5 so as to be pivotable about a respective axis 31. The coupling rod 17 and the auxiliary coupling rod 27 are arranged parallel to each other. This parallel arrangement also holds for the base rods 29 as well as for the auxiliary rods 21 i.e., rods 29 are parallel and rods 21 are parallel. The distance between the axes 23 of the coupling rod 17 is equal to the distance between the axes 25 of the auxiliary coupling rod 27; the distance between the axes 25 and 31 is the same for both base rods 29 and the distance between the axes 23 and 25 is the same for both auxiliary rods 21.

The auxiliary coupling rod 27 serves to pass during operation through a dead position of the coupling rod 17 and to neutralize tolerances in the dimensions of the cranks. The dead position is a position of the coupling rod 17, in which the crank 13 and the coupling rod 17 are directed parallel to each other.

Figure 2:
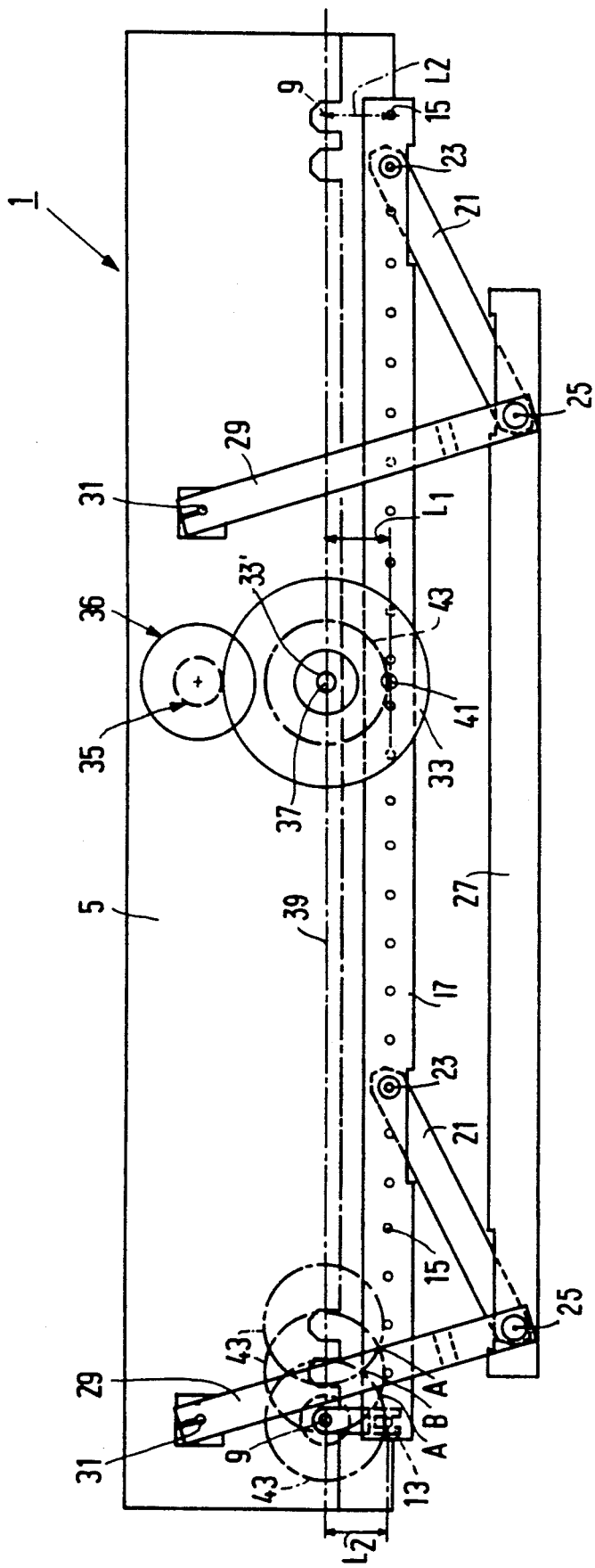

FIG. 2 is a plan view of the device 1 according to the invention. With reference to this Figure, the operation of the parallel mechanism 19, the drive of the coupling rod 17 and the paths described by the crank 13 are explained more fully.

The coupling rod 17 is driven by a toothed wheel 33, which is coupled via a gear wheel transmission 35 to a motor 36. Wheel 33 is rotatably secured to frame 5 via shaft 33' for rotation about axis 37. The axis of rotation 37 of the toothed wheel 33 is located in the same plane 39 as the axis 9 of the pick-up devices 3. The toothed wheel 33 is coupled via a pin 41 to the coupling rod 17, a distance L1 between the axis 37 of the toothed wheel 33 and the pin 41, distance L1 being equal to a distance L2 between the axis 9 of a pick-up device 3 and the associated crank 13 pin 15. A line perpendicular to the axis 37 from the toothed wheel 33 to the pin 41 and a line perpendicular to the axis 9 from a pick-up device 3 to a pin 15 extend parallel to each other. Due to the rotation of the toothed wheel 33 by means of the motor 36, a circular path 43 is described by the pin 41. By means of the pin 41, the coupling rod 17 describes a circular path so that the cranks 13 of all pick-up devices 3 also describe equal circular paths 43. Paths 43 of adjacent pick-up devices 3 intersect each other in the points A and B (see FIG. 2).

The pick-up devices 3 are arranged at a comparatively short relative distance, as a result of which a compact construction of the device is obtained.

Figure 3:
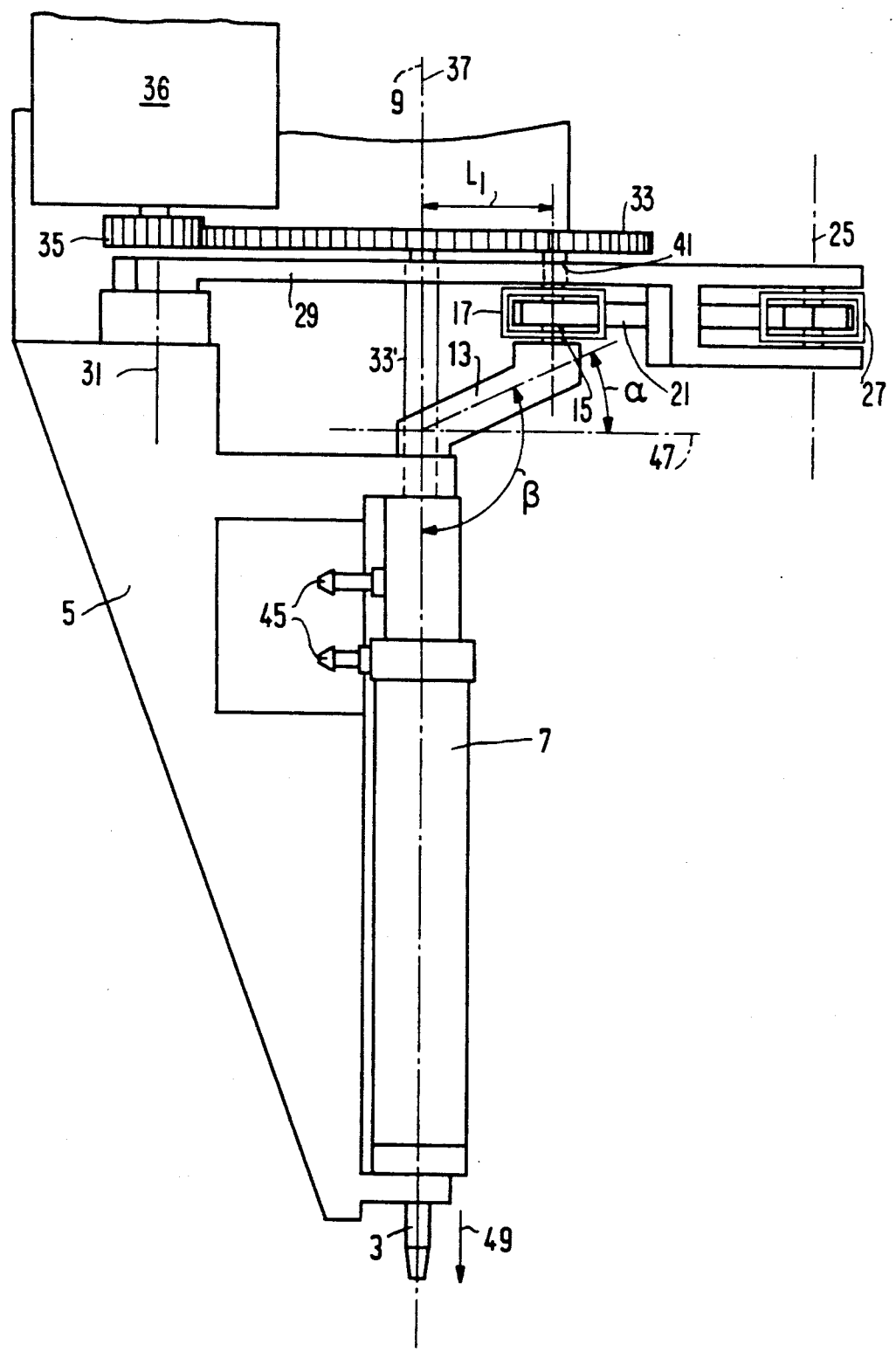

An embodiment of a pick-up device 3 according to the invention is shown in FIG. 3. The cylindrical pick-up device 3 is rotatable about axis 9 and is journalled coaxially in a circular holder 7, while it is provided with a coaxially arranged duct 11. A subatmospheric pressure is produced through connections 45 of the holder 7 in the duct 11 of the pick-up device 3. The crank 13 encloses an obtuse angle $\beta$ with the centre line of the pick-up device 3 and an acute angle $\alpha$ with a plane of projection 47, which is perpendicular to the axis 9 of the pick-up device 3. (The projection plane 47 is perpendicular to the plane of FIG. 3.) The angle $\alpha$ forms part of the angle $\beta$, while it holds that $\beta = \alpha + 90°$.

By means of the pick-up device 3, components can be picked up in that a subatmospheric pressure is produced in the duct 11 of the pick-up device 3. The pick-up device 3 is slipped partly out of the holder 7 in a direction indicated by the arrow 49 during the pick-up operation. After the pick-up device 3 has picked up a component, the pick-up device 3 is slipped for the major part back into the holder 7. When the component is placed on a support for components, the pick-up device 3 is first slipped out of the holder 7; the subatmospheric pressure is eliminated, as a result of which the component is placed on the support.

Each pick-up device can be driven individually to pick up or to place a component. It is then necessary that the pick-up device is slipped out of the holder when picking up or placing components. Thus, for example, during placement, an adjacent pick-up device is prevented from colliding with components already placed on the support.

For picking up components, the device 1 should be moved to a pick-up position. For placing components, the device 1 is moved to a placement position above a support for components. This may be effected, for example, by means of a device described in U.S. Pat. No. 4,644,642.

By means of a device according to the invention, the components picked up by the pick-up devices can be rotated and directed very carefully, while the pick-up devices are arranged at a comparatively small relative distance. If a higher accuracy is required, this can be simply obtained in that the length of the cranks 13 is increased. As a matter of course, the toothed wheel must then also engage with the coupling rod at a greater distance (L1=L2).

In the embodiment described above of a device according to the invention, the pick-up devices form one kind of manipulation. However, manipulators in other forms may also comprise tools, sensors, carriers of pins etc., by which accurate angular rotations must be performed. For this purpose, known manipulators may be used, which, after having been provided with a suitable arm, such as arm 13 are suitable for use in a device according to the invention.

The axes of rotation of the manipulators need not absolutely be located in the same plane, as in the embodiment shown. For example, the parallel axes may be arranged in a triangle. Instead of by a coupling rod, the coupling member may then be constituted by a coupling plate, which is pivotably connected to the arms of the manipulators.

The pick-up device in the embodiment shown picks up components by means of subatmospheric pressure produced in the duct. The pick-up device could also pick up components by means of grippers.

The movement of the pick-up device in the holder in the direction of the arrow 49 may be omitted when the pick-up devices simultaneously pick up or place components and there is no risk of collision.

The auxiliary coupling rod in the embodiment of a device according to the invention assists the coupling rod in passing through a dead position of the coupling rod. However, this may also be realized by known means. If the rotation of the manipulators is limited to a part of a complete rotation and a dead position of the coupling rod is not reached, mechanisms for passing through the dead position may be omitted. Thus, the device is simplified.

What is claimed is:

1. A component manipulation device comprising:
   a support;
   at least two component manipulators, each rotatably secured to the support for rotation about a separate corresponding first axis, said first axes being spaced in parallel relation;

a coupling member; and a crank arm secured to each manipulator and pivotably connected to said coupling member for rotation about a second axis, said arms for rotating the manipulators about their respective first axes, the arms having the same length, each arm enclosing an obtuse angle with the first axis of the manipulator to which that arm is secured, each said arms enclosing an acute angle with a plane normal to said first axes, said acute angle being included in said obtuse angle, each arm having a given point with the same relative location on that arm, said arms being spaced so that when rotated about their corresponding second axes the given points of the arms of two adjacent manipulators describe paths, which, when viewed parallel to said first axes in a projection plane, intersect each other in said projection plane.

2. The device of claim 1 wherein said manipulators each comprises a component pick-up element.

3. The device of claim 1 wherein said coupling member comprises first and second parallel rods, the first rod for pivotably securing said arms thereto, a pair of spaced auxiliary third and fourth rods pivotably connected to said first and second rods to form a parallel mechanism, fifth and sixth parallel base rods rotatably respectively connected at one end in spaced relation to a corresponding different one of the auxiliary third and fourth rods and rotatably connected at their other end in fixed spaced relation to said support, and drive means coupled to the support for displacing said first rod.

4. The device of claim 3 wherein said manipulators each comprises a component pick-up suction element.

5. A positioning device for placing electrical components on a support comprising:

a support;

at least two electrical component manipulators, each secured to the support for rotation about a corresponding first fixed axis, the first axes being parallel;

a coupling member; and a crank arm secured to each manipulator and pivotably connected to said coupling member for rotation about a second axis, said arms rotating the manipulators about their respective first axes, the arms having the same length, each arm having a given point with the same relative location on that arm, said arms being spaced so that when rotated about their corresponding second axes, the given points of the arms of two adjacent manipulators describe paths, which, when viewed parallel to said first axes in a projection plane, intersect each other in said projection plane.

6. A component manipulation device comprising:

a support;

a plurality of component pick-up devices each rotatably secured to said support in fixed spaced relation relative to the support;

a device drive rod;

a plurality of cranks each secured to a different device and rotatably secured to said drive rod for rotating said devices in response to displacement of said rod;

drive means coupled to said support for displacing said drive rod to rotate said devices;

first link means for forming with said drive rod a parallel four bar linkage in which a first bar is rotatably secured parallel to the drive rod via second and third like parallel bars rotatably secured at their ends, the second and third bars each being secured to respective different opposing ends of the drive rod and first bar; and second link means rotatably secured to the support and to said opposing ends of said first bar.

* * * * *